United States Patent
Ohnishi et al.

(10) Patent No.: US 7,858,275 B2
(45) Date of Patent: Dec. 28, 2010

(54) PHOTOSENSITIVE RESIN COMPOSITION AND COLOR FILTER

(75) Inventors: Hiroyuki Ohnishi, Kawasaki (JP); Yasuaki Sugimoto, Kawasaki (JP); Isao Tateno, Kawasaki (JP); Masaru Shida, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 256 days.

(21) Appl. No.: 11/908,481

(22) PCT Filed: Mar. 10, 2006

(86) PCT No.: PCT/JP2006/304770
§ 371 (c)(1), (2), (4) Date: Sep. 12, 2007

(87) PCT Pub. No.: WO2006/100942
PCT Pub. Date: Sep. 28, 2006

(65) Prior Publication Data
US 2009/0067076 A1 Mar. 12, 2009

(30) Foreign Application Priority Data
Mar. 18, 2005 (JP) ............... 2005-078946

(51) Int. Cl.
G03F 7/023 (2006.01)
G03F 9/00 (2006.01)
(52) U.S. Cl. ............. 430/7; 430/190; 430/191; 430/192; 430/193
(58) Field of Classification Search .......... 430/7, 430/190, 191, 192, 193
See application file for complete search history.

(56) References Cited

U.S. PATENT DOCUMENTS

| | | | | |
|---|---|---|---|---|
| 5,275,908 | A | * | 1/1994 | Elsaesser et al. ............ 430/165 |
| 5,376,496 | A | * | 12/1994 | Elsaesser et al. ............ 430/165 |
| 6,984,476 | B2 | * | 1/2006 | Kobayashi et al. ............ 430/7 |
| 2003/0232259 | A1 | | 12/2003 | Araki |

FOREIGN PATENT DOCUMENTS

| JP | 5139024 | 4/1976 |
|---|---|---|
| JP | 01100538 | 4/1989 |
| JP | 07082491 | 3/1995 |
| JP | 07084121 | 3/1995 |
| JP | 08137098 | 5/1996 |
| JP | H11-030857 | 2/1999 |
| JP | 2003270784 | 9/2003 |
| JP | 2004240115 | 8/2004 |

OTHER PUBLICATIONS

International Search Report from PCT/JP2006/304770 mailed on Jun. 13, 2006.
Office Action issued in counterpart Taiwanese Patent Application No. 095108623, dated Oct. 7, 2009.

* cited by examiner

Primary Examiner—John S Chu
(74) Attorney, Agent, or Firm—Knobbe, Martens, Olson & Bear, LLP

(57) ABSTRACT

A positive photosensitive resin composition with favorable heat resistance and transparency is provided. The photosensitive resin composition contains a resin component (A1) having a structural unit (a1') obtained by substituting at least a portion of hydrogen atoms of phenolic hydroxyl groups within a structural unit represented by a general formula (a1) shown below with a naphthoquinone-1,2-diazide-5-(and/or -4-) sulfonyl group.

[Formula 1]

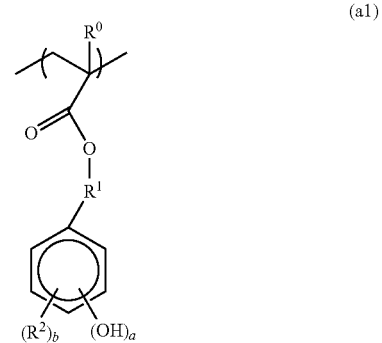

(a1)

(In the above general formula, $R^0$ represents a hydrogen atom or methyl group, $R^1$ represents a single bond or an alkylene group of 1 to 5 carbon atoms, $R^2$ represents an alkyl group of 1 to 5 carbon atoms, a represents an integer from 1 to 5, b represents either 0 or an integer from 1 to 4, and a+b is no greater than 5. If two or more $R^2$ groups exist, then these $R^2$ groups may be either the same or mutually different.)

4 Claims, No Drawings

PHOTOSENSITIVE RESIN COMPOSITION AND COLOR FILTER

RELATED APPLICATIONS

This application is the U.S. National Phase filing under 35 U.S.C. §371 of PCT/JP2006/304770, filed Mar. 10, 2006, which designated the United States and was published in a language other than English, which claims priority under 35 U.S.C. §119(a)-(d) to Japanese Patent Application No. 2005-078946, filed Mar. 18, 2005. The content of these applications is incorporated herein by reference in their entireties.

TECHNICAL FIELD

The present invention relates to a photosensitive resin composition and a color filter.

BACKGROUND ART

In a color filter used, for example, within a color display device having a liquid crystal display element, pixels (color layers) of each of the colors red (R), green (G) and blue (B) are usually enclosed within a lattice-like light-shielding layer called a black matrix.

A method of forming the color layers and black matrix of the color filter by a photolithography method that uses a photosensitive resin composition containing a colorant is already known.

The photosensitive resin composition used for producing the color layers and black matrix by the photolithography method described above typically employs a so-called "negative" resin that is cured by irradiation with light. It is required that a photosensitive resin composition containing a colorant that is used during formation of a color filter by a photolithography method is capable of forming a very fine pattern of the black matrix or color layer (pixels) with a favorable profile. Accordingly, the use of a "positive" resin instead of the conventional "negative" resins is desirable, and "positive" resins are now starting to be proposed (see patent reference 1). In order to improve the coloring of the formed color filter, the pattern formed from the photosensitive resin composition (containing no colorant) preferably exhibits a high degree of transparency.

[Patent Reference 1]
Japanese Unexamined Patent Application, First Publication No. 2003-270784

DISCLOSURE OF INVENTION

Problems to be Solved by the Invention

However, when a color filter, lens or interlayer insulating film or the like is formed using a positive photosensitive resin composition containing a conventional novolak resin, acrylic resin or hydroxystyrene resin or the like, the resulting heat resistance is inadequate, and the transparency is also unsatisfactory.

Specifically, if the heat resistance is inadequate, then problems such as pattern shrinkage (so-called thickness loss) or collapse of the pattern shape can occur during the heating step that is usually conducted, meaning the desired pattern shape cannot be formed. Moreover, if the resin component colors upon heating, then the desired transparency cannot be obtained. Particularly in the case of color filters, if the transparency is poor, then the prescribed R, G or B coloring cannot be achieved.

The present invention takes the above circumstances into consideration, with an object of providing a positive photosensitive resin composition that exhibits favorable heat resistance and transparency, as well as a color filter that uses this resin composition.

Means for Solving the Problems

In order to achieve the above object, a photosensitive resin composition of the present invention contains a resin component (A1) having a structural unit (a1') obtained by substituting at least a portion of the hydrogen atoms of phenolic hydroxyl groups within a structural unit represented by a general formula (a1) shown below with a naphthoquinone-1,2-diazide-5-(and/or -4-)sulfonyl group.

[Formula 1]

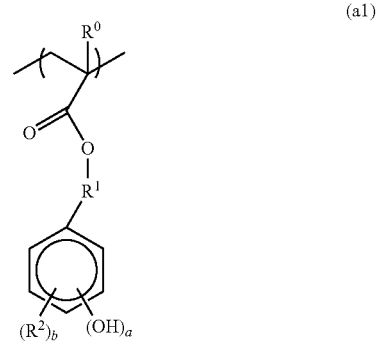

(a1)

(In the above general formula, $R^0$ represents a hydrogen atom or methyl group, $R^1$ represents a single bond or an alkylene group of 1 to 5 carbon atoms, $R^2$ represents an alkyl group of 1 to 5 carbon atoms, a represents an integer from 1 to 5, b represents either 0 or an integer from 1 to 4, and a+b is no greater than 5. If two or more $R^2$ groups exist, then these $R^2$ groups may be either the same or mutually different.)

Furthermore, the present invention also provides a color filter having a pattern formed using the photosensitive resin composition of the present invention.

A "structural unit" refers to a monomer unit that contributes to the formation of a polymer.

EFFECTS OF THE INVENTION

According to the present invention, a positive photosensitive resin composition that exhibits favorable heat resistance and transparency can be provided.

The photosensitive resin composition of the present invention is ideal for forming the pattern used to generate a color filter, and enables the formation of a high-quality color filter.

BEST MODE FOR CARRYING OUT THE INVENTION

Resin Component (A1)

The photosensitive resin composition of the present invention contains a resin component (A1) having a structural unit (a1') obtained by substituting at least a portion of the hydrogen atoms of phenolic hydroxyl groups within the structural unit represented by the above general formula (a1) with a naphthoquinone-1,2-diazide-5-(and/or -4-) sulfonyl group (hereafter also referred to as NQD group).

In the resin component (A1), the NQD group exhibits a dissolution-inhibiting effect that makes the component either insoluble or sparingly soluble in alkali developing liquids. Upon exposure, the NQD group absorbs light and reacts with moisture, causing the naphthoquinone-1,2-diazide to be converted to an indene carboxylic acid, thereby causing the resin component (A1) to change to a state that is soluble in alkali developing liquids. In other words, the exposed portions develop a higher alkali dissolution rate than the unexposed portions. In other words, a photosensitive resin composition of the present invention that contains this resin component (A1) functions as a positive resist. In the following description, the resin component (A1) may also be referred to as the "component (A1)".

Structural Unit (a1')

The structural unit (a1') is an ester of a structural unit (a1) represented by the above general formula (a1), and a naphthoquinone-1,2-diazide-5-sulfonyl halide and/or a naphthoquinone-1,2-diazide-4-sulfonyl halide.

In other words, the resin component (A1) is obtained by conducting an esterification reaction between an alkali-soluble resin component containing at least the structural unit (a1), and a naphthoquinone-1,2-diazide-5-sulfonyl halide and/or a naphthoquinone-1,2-diazide-4-sulfonyl halide, thereby substituting either a portion of, or all of, the hydrogen atoms of the phenolic hydroxyl groups within the structural units (a1) with NQD groups.

This esterification reaction can be conducted, for example, by reacting the alkali-soluble resin component containing the structural unit (at) with naphthoquinone-1,2-diazide-5-sulfonyl chloride and/or a naphthoquinone-1,2-diazide-4-sulfonyl chloride within a suitable solvent such as dioxane, in the presence of an alkali such as triethanolamine, an alkali carbonate or an alkali bicarbonate.

In addition to the structural unit (a1'), the component (A1) may also contain the structural unit (a1), and resins containing both of the structural units (a1') and (a1) are preferred.

In those cases where the component (A1) contains the structural units (a1') and (a1), although there is no necessity that the structure obtained by substituting the NQD group of the structural unit (a1') within the component (A1) with a hydrogen atom is identical with the structure of the structural unit (a1) that exists within the same component (A1), because the component (A1) is usually produced by substituting a portion of the hydrogen atoms of phenolic hydroxyl groups within the structural units (a1) of a resin component containing such structural units (a1) with NQD groups, the structure obtained by substituting the NQD group of the structural unit (a1') that exists within the component (A1) with a hydrogen atom is usually identical with the structure of the structural unit (a1) that exists within the same component (A1).

A resin component obtained by substituting a portion of the hydrogen atoms of phenolic hydroxyl groups within the structural units (a1) of a resin component containing such structural units (a1) with NQD groups, in the manner described above, may be referred to as the "resin component (A2)" or the "component (A2)" within this description.

The ratio of the number of NQD groups introduced by the above esterification reaction, relative to the number of phenolic hydroxyl groups (within the alkali-soluble resin containing the structural unit (a1)) prior to introduction of the NQD groups (namely, the esterification ratio) is preferably within a range from 2 to 80%, even more preferably from 10 to 50%, and is most preferably from 15 to 45%.

By ensuring that the esterification ratio is at least 2%, the photosensitivity can be improved, and the resolution can also be improved, Furthermore, ensuring that the esterification ratio is no greater than 80% enables the transparency and heat resistance to be improved.

In those cases where the structural unit (a1) contains a plurality of phenolic hydroxyl groups (those cases where a is from 2 to 5), either the hydrogen atoms of all of the plurality of phenolic hydroxyl groups may be substituted with NQD groups, or the hydrogen atoms of a portion of the plurality of phenolic hydroxyl groups may be substituted with NQD groups, meaning residual phenolic hydroxyl groups may exist within the structural unit (a1').

Structural Unit (a1)

In the above general formula (a1), $R^0$ represents a hydrogen atom or methyl group, and is preferably a methyl group.

$R^1$ represents a single bond or a straight-chain or branched-chain alkylene group of 1 to 5 carbon atoms such as a methylene group, ethylene group, propylene group, isopropylene group, n-butylene group, isobutylene group, tert-butylene group, pentylene group, isopentylene group, or neopentylene group. Of the alkylene groups, a methylene group or ethylene group is preferred.

Of these possibilities, a single bond or an ethylene group is preferred, and a single bond is particularly desirable.

$R^2$ represents a straight-chain or branched-chain alkyl group of 1 to 5 carbon atoms, and suitable examples include a methyl group, ethyl group, propyl group, isopropyl group, n-butyl group, isobutyl group, tert-butyl group, pentyl group, isopentyl group, or neopentyl group. From an industrial perspective, a methyl group or ethyl group is preferred. b represents either 0 or an integer from 1 to 4, and is most preferably 0.

a represents an integer from 1 to 5, although in terms of the effects achieved and the ease of production, is preferably 1.

Furthermore, within the benzene ring, at least one hydroxyl group is preferably bonded to position 4, wherein the position at which the —C(O)—O—$R^1$— group is bonded is referred to as position 1.

A resin component (A2) containing both of the structural units (a1') and (a1) can be described in the following manner.

Namely, the photosensitive resin composition of the present invention contains a resin component (A2) having a structural unit represented by the above general formula (a1), wherein at least a portion of the hydrogen atoms of all phenolic hydroxyl groups of the general formula (a1) contained within the resin component (A2) have been substituted with a naphthoquinone-1,2-diazide-5-(and/or -4-)sulfonyl group.

In the resin component (A2), the ratio of the number of NQD groups introduced by the above esterification reaction, relative to the number of the hydrogen atoms of all phenolic hydroxyl groups within the general formula (a1) (namely, the esterification ratio) is preferably within a range from 2 to 80%, even more preferably from 10 to 50%, and is most preferably from 15 to 45%.

By ensuring that the esterification ratio is at least 2%, the photosensitivity can be improved, and the resolution can also be improved, Furthermore, ensuring that the esterification ratio is no greater than 80% enables the transparency and heat resistance to be improved.

Examples of preferred structures for the structural unit (a1) are shown below.

[Formula 2]

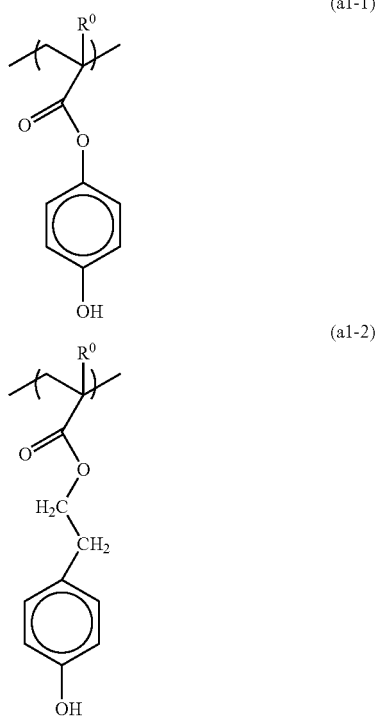

(In the Above General Formulas, R⁰ is as Defined Above.)

Of the structural units represented by these chemical formulas (a1-1) and (a1-2), structural units represented by (a1-1) are preferred. Of the structural units represented by (a1-1), the structural unit in which $R^0$ is a methyl group is preferred, and hereafter this structural unit may also be referred to as "PQMA".

The structural units (a1') that exist within the resin component (A1) may be of a single variety, or may include two or more different varieties. Moreover, the structural units (a1) that exist within the resin component (A1) may be of a single variety, or may include two or more different varieties.

In addition to the structural unit (a1'), or the combination of the structural units (a1) and (a1'), the component (A1) or the component (A2) may also include one or more other structural units that are copolymerizable with the structural unit (a1).

Of the combined total of all the structural units that constitute the component (A1) or component (A2), the structural units (a1) and (a1') preferably represent at least 50 mol %, and even more preferably 80 mol % or greater.

In the component (A1), the upper limit for the proportion of the structural unit (a1') may be 100 mol %.

By ensuring that the proportions of each of the structural units satisfy the above ranges, the effects of the present invention can be further enhanced.

In the component (A1) or the component (A2), there are no particular restrictions on the other structural units that can be used in addition to the structural units (a1) and (a1'), and examples include structural units derived from compounds containing a polymerizable unsaturated bond, such as acrylic acid, methacrylic acid, acrylate esters, acrylamides, methacrylate esters, methacrylamides, allyl compounds, vinyl ethers, vinyl esters, styrenes, and crotonate esters.

Examples of suitable acrylate esters include alkyl acrylates (wherein the number of carbon atoms within the alkyl group is preferably from 1 to 10) (such as methyl acrylate, ethyl acrylate, propyl acrylate, butyl acrylate, amyl acrylate, ethylhexyl acrylate, octyl acrylate, t-octyl acrylate, chlorethyl acrylate, 2,2-dimethylhydroxypropyl acrylate, 2-hydroxyethyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate), and aryl acrylates (such as phenyl acrylate).

Examples of suitable methacrylate esters include alkyl methacrylates (wherein the number of carbon atoms within the alkyl group is preferably from 1 to 10) (such as methyl methacrylate, ethyl methacrylate, propyl methacrylate, isopropyl methacrylate, amyl methacrylate, hexyl methacrylate, cyclohexyl methacrylate, benzyl methacrylate, chlorbenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furyl methacrylate, and tetrahydrofurfuryl acrylate), and aryl methacrylates (such as phenyl methacrylate, cresyl methacrylate, and naphthyl methacrylate).

Examples of suitable acrylamides include acrylamide, N-alkylacrylamides (wherein the alkyl group preferably contains from 1 to 10 carbon atoms, and suitable examples include a methyl group, ethyl group, propyl group, butyl group, t-butyl group, heptyl group, octyl group, cyclohexyl group, hydroxyethyl group, or benzyl group), N-arylacrylamides (wherein examples of the aryl group include a phenyl group, tolyl group, nitrophenyl group, naphthyl group, and hydroxyphenyl group), N,N-dialkylacrylamides (wherein the alkyl groups preferably contain from 1 to 10 carbon atoms, and suitable examples include a methyl group, ethyl group, butyl group, isobutyl group, ethylhexyl group, and cyclohexyl group), N,N-diarylacrylamides (wherein an example of the aryl groups is a phenyl group), N-methyl-N-phenylacrylamide, N-hydroxyethyl-N-methylacrylamide, and N-2-acetoamidoethyl-N-acetylacrylamide.

Examples of suitable methacrylamides include methacrylamide, N-alkylmethacrylamides (wherein the alkyl group preferably contains from 1 to 10 carbon atoms, and suitable examples include a methyl group, ethyl group, t-butyl group, ethylhexyl group, hydroxyethyl group, or cyclohexyl group), N-arylmethacrylamides (wherein an example of the aryl group is a phenyl group), N,N-dialkylmethacrylamides (wherein examples of the alkyl group include an ethyl group, propyl group, or butyl group), N,N-diarylmethacrylamides (wherein an example of the aryl groups is a phenyl group), N-hydroxyethyl-N-methylmethacrylamide, N-methyl-N-phenylmethacrylamide, and N-ethyl-N-phenylmethacrylamide.

Examples of suitable allyl compounds include allyl esters (such as allyl acetate, allyl caproate, allyl caprylate, allyl laurate, allyl palmitate, allyl stearate, allyl benzoate, allyl acetoacetate, and allyl lactate), and allyloxyethanol.

Examples of suitable vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chlorethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), vinyl aryl ethers (such as vinyl phenyl ether, vinyl tolyl ether, vinyl chlorphenyl ether, vinyl 2,4-dichlorphenyl ether, vinyl naphthyl ether, and vinyl anthranyl ether).

Examples of suitable vinyl esters include vinyl butyrate, vinyl isobutyrate, vinyl trimethylacetate, vinyl diethylacetate, vinyl valerate, vinyl caproate, vinyl chloracetate, vinyl dichloracetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorbenzoate, vinyl tetrachlorbenzoate, and vinyl naphthoate.

Examples of suitable styrenes include styrene, alkylstyrenes (such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chlormethylstyrene, trifluoromethylstyrene, ethoxymethylstyrene, and acetoxymethylstyrene), alkoxystyrenes (such as methoxystyrene, 4-methoxy-3-methylstyrene, and dimethoxystyrene), halostyrenes (such as chlorstyrene, dichlorstyrene, trichlorstyrene, tetrachlorstyrene, pentachlorstyrene, bromostyrene, dibromostyrene, iodostyrene, fluorostyrene, trifluorostyrene, 2-bromo-4-trifluoromethylstyrene, and 4-fluoro-3-trifluoromethylstyrene).

Examples of suitable crotonate esters include alkyl crotonates (such as butyl crotonate, hexyl crotonate, and glycerin monocrotonate), and examples of other polymerizable compounds include dialkyl itaconates (such as dimethyl itaconate, diethyl itaconate, and dibutyl itaconate), dialkyl esters of maleic acid or fumaric acid (such as dimethyl maleate and dibutyl fumarate), acrylonitrile and methacrylonitrile.

Of these, preferred structural units include those represented by the formulas (a2) to (a4) shown below.

[Formula 3]

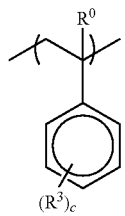

(a2)

(In the above general formula (a2), $R^0$ is as defined above. $R^3$ represents a hydroxyl group or an alkyl group of 1 to 5 carbon atoms, and c represents either 0 or an integer from 1 to 5. If two or more $R^3$ groups exist, then these $R^3$ groups may be either the same or mutually different. c is preferably 0.)

[Formula 4]

(a3)

(In the above general formula, $R^0$ is as defined above. $R^4$ represents an alkyl group of 1 to 5 carbon atoms, or a hydrogen atom.)

Examples of the alkyl group of $R^4$ include the same groups as those described above for $R^2$. Of the various possibilities, $R^4$ is preferably an alkyl group, and is most preferably a methyl group.

[Formula 5]

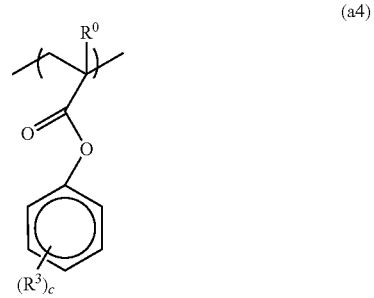

(a4)

(In the above general formula, $R^0$, $R^3$, and c are as defined above. Furthermore, if two or more $R^3$ groups exist, then these $R^3$ groups may be either the same or mutually different.)

In the general formula (a4), $R^3$ and c are as defined above.

The weight average molecular weight (Mw: the polystyrene equivalent value measured by gel permeation chromatography (GPC)) of the component (A1) or the component (A2) is typically within a range from 2,000 to 30,000, and is preferably from 3,000 to 25,000. Ensuring that the molecular weight is at least as large as the lower limit of this range enables the composition to be readily formed as a film, whereas ensuring that the molecular weight is no larger than the upper limit enables a suitable level of alkali solubility to be achieved, which is preferred.

Furthermore, the component (A1) and the component (A2) may each be either a single resin, or a mixture of two or more different resins.

The resin component (A) of the photosensitive resin composition of the present invention may also employ a mixture of the aforementioned component (A1) or (A2), and another alkali-soluble resin (A3). Examples of this component (A3) include an acrylic resin, hydroxystyrene resin, or novolak resin. However, the proportion of the component (A1) or component (A2) within the resin component (A) is typically at least 70% by weight, is preferably 80% by weight or higher, and is most preferably 100% by weight.

Colorant (C)

In the production of a color filter, a colorant (C) is typically blended into the photosensitive resin composition used for producing the black matrix or color layer.

The colorant may be either an organic colorant or an inorganic colorant. There are no particular restrictions on the color tone of the colorant, which may be selected in accordance with the desired tone for the color layer of the color filter, or the desired tone for the black matrix.

The organic colorant is preferably a dye, organic pigment or natural coloring or the like, whereas the aforementioned inorganic colorant is preferably either an inorganic pigment, or an inorganic salt such as barium sulfate known as an extender pigment.

The colorant used in a color filter application preferably exhibits intense coloring and a high level of heat resistance, colorants that exhibit a high level of resistance to thermal degradation are especially preferred, and from the viewpoint of heat resistance, pigments are usually preferred, and the use of organic pigments is particularly desirable.

Examples of these organic pigments include those compounds classified as pigments within the Colour Index (C.I., published by The Society of Dyers and Colourists), and specific examples include the pigments that are assigned the colour index (C.I.) numbers listed below.

C.I. pigment yellow 1 (and the following C.I. pigment yellow pigments listed solely by number), 3, 11, 12, 13, 14, 15, 16, 17, 20, 24, 31, 53, 55, 60, 61, 65, 71, 73, 74, 81, 83, 86, 93, 95, 97, 98, 99, 100, 101, 104, 106, 108, 109, 110, 113, 114, 116, 117, 119, 120, 125, 126, 127, 128, 129, 137, 138, 139, 147, 148, 150, 151, 152, 153, 154, 155, 156, 166, 167, 168, 175, 180, and 185;

C.I. pigment orange 1 (and the following C.I. pigment orange pigments listed solely by number), 5, 13, 14, 16, 17, 24, 34, 36, 38, 40, 43, 46, 49, 51, 55, 59, 61, 63, 64, 71, 73;

C.I. pigment violet 1 (and the following C.I. pigment violet pigments listed solely by number), 19, 23, 29, 30, 32, 36, 37, 38, 39, 40, and 50;

C.I. pigment red 1 (and the following C.I. pigment red pigments listed solely by number), 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 192, 193, 194, 202, 206, 207, 208, 209, 215, 216, 217, 220, 223, 224, 226, 227, 228, 240, 242, 243, 245, 254, 255, 264, and 265;

C.I. pigment blue 1 (and the following C.I. pigment blue pigments listed solely by number), 2, 15, 15:3, 15:4, 15:6, 16, 22, 60, 64, and 66;

C.I. pigment green 7, C.I. pigment green 36, and C.I. pigment green 37;

C.I. pigment brown 23, C.I. pigment brown 25, C.I. pigment brown 26, and C.I. pigment brown 28; and C.I. pigment black 1 and C.I. pigment black 7.

Carbon black is also preferred as a black pigment.

The colorant (C) may use either a single colorant or a mixture of two or more different colorants.

Furthermore, the organic pigment may be purified prior to use by a sulfuric acid recrystallization method, a solvent cleaning method, or a combination of these methods.

The quantity added of the colorant (C) can be altered appropriately in accordance with the desired coloring tone, although in the case of an organic pigment, is typically within a range from 0.1 to 40 parts by weight, and preferably from 1 to 35 parts by weight, per 100 parts by weight of the resin component (A). Ensuring that the quantity is at least as large as the lower limit of this range enables favorable coloring to be achieved. Ensuring that the quantity is no larger than the upper limit enables the prevention of any decrease in the photosensitivity.

Organic Solvent

An organic solvent may be blended into the photosensitive resin composition of the present invention in order to improve the coating properties and regulate the composition viscosity.

Examples of suitable organic solvents include benzene, toluene, xylene, methyl ethyl ketone, acetone, methyl isobutyl ketone, cyclohexanone, methanol, ethanol, propanol, butanol, hexanol, cyclohexanol, ethylene glycol, diethylene glycol, glycerin, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 3-methoxybutyl acetate, 3-methyl-3-methoxybutyl acetate, propylene glycol monomethyl ether acetate (PGMEA), propylene glycol monomethyl ether propionate, propylene glycol monoethyl ether propionate, methyl carbonate, ethyl carbonate, propyl carbonate, and butyl carbonate. Of these, PGMEA is preferred.

There are no particular restrictions on the quantity used of the organic solvent, although the quantity should be set in accordance with the coating film thickness, at a concentration that enables favorable application of the composition to a substrate or the like.

Furthermore, the photosensitive resin composition may also include various additives such as sensitizers, antifoaming agents, and surfactants.

Any of the sensitizers used in conventional positive resists can be used as the sensitizer. Examples include compounds having a phenolic hydroxyl group with a molecular weight of no more than 1,000.

Any conventional antifoaming agent may be used as the above antifoaming agent, and examples include silicone-based compounds and fluorine-based compounds.

Any conventional surfactant may be used as the above surfactant, and examples include anionic, cationic, and nonionic compounds.

The photosensitive resin composition of the present invention can be prepared, for example, using the method described below.

Namely, the photosensitive resin composition can be prepared by adding an organic solvent and any other additives that may be required to the resin component (A), conducting mixing (dispersion and kneading) using a mixing device such as a triple roll mill, ball mill or sand mill, and then filtering the resulting mixture through a 5 μm membrane filter.

The photosensitive resin composition of the present invention can be used favorably for forming the pattern that functions as the black matrix and/or color layer of a color filter.

In particular, a photosensitive resin composition of the present invention containing a black pigment as the colorant (C) is ideal for forming a black matrix pattern.

Furthermore, a photosensitive resin composition of the present invention containing a pigment (C) that has been selected so as to yield the desired color tone is ideal for forming a pattern that functions as a color layer within a color filter.

As follows is an example of a method of forming a black matrix (or a color layer) using the photosensitive resin composition of the present invention.

First, the photosensitive resist composition is applied to a substrate using either a contact transfer coating device such as a roll coater, reverse coater or bar coater, or a non-contact coating device such as a spinner (a rotational coating device) or curtain flow coater. The substrate is an optically transparent substrate such as a glass plate with a thickness of 0.5 to 1.1 mm.

In order to improve the adhesion between the glass substrate and the photosensitive resin composition, the glass substrate may be pre-coated with a silane coupling agent. Alternatively, a silane coupling agent may be added during preparation of the photosensitive resin composition.

Following the above application step, the composition is dried to remove the solvent. There are no particular restrictions on the drying method used, and any one of the following methods may be used: (1) a method in which the composition is dried on a hotplate at 80 to 120° C., and preferably at 90 to 110° C., for a period of 60 to 120 seconds, (2) a method in which the composition is left to stand at room temperature for a period of several hours to several days, and (3) a method in which the solvent is removed by placing the composition in a hot air heater or an infrared heater for a period of several tens of minutes to several hours.

Subsequently, the composition is partially exposed by irradiation with an activated energy beam such as ultra violet light or an excimer laser through a positive mask. The energy beam irradiation dose varies depending on the nature of the photosensitive resin composition, but is preferably within a range from approximately 30 to 2,000 mJ/cm.

The exposed film is then patterned to the desired shape by developing with a developing liquid.

There are no particular restrictions on the developing method, and immersion methods and spray methods and the like can be used. Specific examples of suitable developing liquids include organic compounds such as monoethanolamine, diethanolamine and triethanolamine, as well as aqueous solutions of sodium hydroxide, potassium hydroxide, sodium carbonate, ammonia, and quaternary ammonium salts.

Following developing, a postbake is conducted to harden the developed pattern. Furthermore, the formed pattern is preferably subjected to exposure across the entire surface.

In addition, because the composition is a positive photosensitive resin composition, a half tone mask can be used as the aforementioned mask, meaning a pattern with varying film thickness can be formed in a single step.

According to the present invention, a positive photosensitive resin composition that exhibits favorable heat resistance and transparency can be provided.

In a state that excludes colorants such as the pigment (C), the photosensitive resin composition of the present invention exhibits favorable transparency and excellent heat resistance, and consequently the resin component is resistant to coloration even when exposed to comparatively high temperatures.

In other words, the resin component is resistant to coloration even during color filter production processes that include a step of heating at a comparatively high temperature, meaning favorable coloring can be obtained within the coloring layer of the color filter.

Furthermore, the resolution of the photosensitive resin composition of the present invention is also favorable, enabling the composition to meet the demands of microfabrication. The composition is particularly effective for the production of RGB and CMY color filters. Furthermore, because the composition exhibits excellent heat resistance, it is resistant to thermal sag of the pattern caused by heating, meaning a color layer or black matrix of the desired size can be obtained. Accordingly, a high-quality color filter can be produced.

Furthermore, the pattern formed from the above photosensitive resin composition preferably exhibits a transmittance level for light within the visible light region from 400 to 800 nm that is at least 70%, even more preferably 80% or higher, and most preferably 90% or higher. This enables a pattern (color layer) formed from a photosensitive resin composition containing an added pigment to exhibit particularly favorable coloring.

Those cases in which the structural unit (a1-1) is used within the resin component (A1) are particularly desirable, as they yield a transmittance for light within the visible light region of 90% or higher, even following heat treatment at 250° C.

EXAMPLES

Examples 1 to 3

First, the resin component (A1) was prepared. Namely, 100 parts by weight of a homopolymer (Mw: 13,000) formed from the structural unit PQMA represented by the above chemical formula (a1-1), and sufficient naphthoquinone-1,2-diazide-5-sulfonyl chloride to provide a ratio of 15 mol % relative to the total number of mols of phenolic hydroxyl groups within the above polymer were subjected to an addition reaction in acetone in the presence of triethylamine, thus yielding a resin component (A1-1) with an esterification ratio of 15%.

Using the same method as above, a resin component (A1-2) with an esterification ratio of 30% was prepared.

Using the above naphthoquinone-1,2-diazide-5-sulfonyl chloride and the same method as above, a resin component (A1-3) with an esterification ratio of 45% was also prepared.

The components listed below were mixed together to form a series of positive photosensitive resin compositions with a solid fraction concentration of approximately 25% by weight.

| | |
|---|---|
| Resin Component (A): | 100 parts by weight of the resin component prepared above ((A1-1) in the example 1, (A1-2) in the example 2, and (A1-3) in the example 3) |
| Sensitizer: | 20 parts by weight of 4,4'-cyclohexylidene bisphenol |
| Surfactant: | 0.1 parts by weight of XR-104 (a product name, manufactured by Dainippon Ink and Chemicals, Incorporated) |
| Solvent: | PGMEA |

Comparative Example 1

With the exceptions of replacing the resin component (A) with a polyhydroxystyrene (Mw: 10,000), and adding 30 parts by weight of 1-[1-(4-hydroxyphenyl)isopropyl]-4-[1,1-bis(4-hydroxyphenyl)ethyl]benzene and the esterification product of 1 mol of bis(4-hydroxy-2,3,5-trimethylphenyl)-2-hydroxyphenylmethane and 2 mols of 1,2-naphthoquinonediazide-5-sulfonyl chloride as photosensitizers, a positive photosensitive resin composition was prepared in the same manner as the example 1.

<Evaluation of Resolution>

The photosensitive resin compositions of the examples 1 to 3 and the comparative example 1 were each applied to a glass substrate, and subsequently heated at 110° C. for 90 seconds, thus forming a series of photosensitive resin layers with a thickness of 1,000 nm. Subsequently, each resin layer was patterned by exposure through a mask at an energy of 100 mJ using an exposure apparatus Nikon i10D (a product name, manufactured by Nikon Corporation), and was then developed using a 2.38% by weight aqueous solution of tetramethylammonium hydroxide, thereby forming line patterns.

The width of these lines was gradually narrowed, and the narrowest width for which resolution was achievable was recorded as the critical resolution. The results are shown in Table 1.

<Evaluation of Transparency and Heat Resistance>

The lines obtained above having a width at the critical resolution were heated at 250° C. for 30 minutes, and the transparency of the lines relative to light with a wavelength of 500 nm was measured before and after the heat treatment. For each composition, the ratio of the transmittance after heating relative to the transmittance before heating is shown in Table 1. Measurement of the transmittance was conducted using an apparatus UV-2500PC (manufactured by Shimadzu Corporation).

Moreover, the heat resistance was evaluated by inspecting the shape of the lines following heating using an electron microscope. Those compositions for which the shape of the pattern showed almost no change from the shape prior to heating were recorded using the symbol 0, whereas those compositions for which thermal sag and the like had caused a change in the pattern shape were recorded using the symbol x. The results are shown in Table 1.

TABLE 1

|  | Critical resolution | Change in transmittance | Heat resistance |
|---|---|---|---|
| Example 1 | 2 μm | 94% | o |
| Example 2 | 1 μm | 93% | o |
| Example 3 | 2 μm | 91% | o |
| Comparative example 1 | 10 μm | 79% | x |

From the results in Table 1 it is evident that the photosensitive resin compositions of the present invention exhibited favorable resolution.

Furthermore, the heat resistance was also favorable, and favorable transmittance was obtained even following heating. In other words, the compositions were confirmed as being resistant to coloration caused by heating. Furthermore, no thermal sag of the patterns due to heating was observed, and the rectangularity of the patterns was favorably maintained.

Production Example 1

Pigment-containing photosensitive resin compositions were produced by adding 30 parts by weight of a red pigment dispersion "CF Red EX-109" (containing 20 parts by weight of C.I. PR-177, an anthraquinone-based red pigment; manufactured by Mikuni Color Co., Ltd.) to 100 parts by weight of the resin component from each of the photosensitive resin compositions of the examples 1 to 3. Using these pigment-containing photosensitive resin compositions, exposure and developing were conducted in the same manner as described above, thus yielding line patterns.

As a result, each of the compositions was able to form a pattern with no problems. Furthermore, the change in transmittance relative to light with a wavelength of 500 nm was very favorable, and at least 90% in each case.

INDUSTRIAL APPLICABILITY

A positive photosensitive resin composition with favorable heat resistance and transparency can be provided, and this composition can be applied to a positive photosensitive resin composition and a color filter that uses such a composition.

The invention claimed is:

1. A photosensitive resin composition, comprising a resin component (A1) and an organic pigment, the resin component (A1) consisting of a structural unit (a1) shown below and a structural unit (a1') obtained by substituting at least a portion of hydrogen atoms of phenolic hydroxyl groups within a structural unit represented by a general formula (a1) shown below with a naphthoquinone-1,2-diazide-5-(and/or -4-)sulfonyl group:

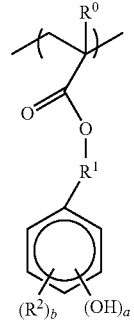

(a1)

(wherein, $R^0$ represents a hydrogen atom or methyl group, $R^1$ represents a single bond, $R^2$ represents an alkyl group of 1 to 5 carbon atoms, a represents an integer from 1 to 5, b represents either 0 or an integer from 1 to 4, a+b is no greater than 5, and if two or more $R^2$ groups exist, then said $R^2$ groups may be either identical or mutually different).

2. A photosensitive resin composition, comprising a resin component (A2) and an organic pigment, the resin component (A2) consisting of a structural unit represented by a general formula (a1) shown below, wherein, of hydrogen atoms of all phenolic hydroxyl groups of said general formula (a1) within said resin component (A2), at least a portion of said hydrogen atoms are substituted with a naphthoquinone-1,2-diazide-5-(and/or -4-)sulfonyl group:

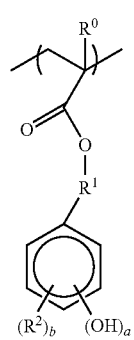

(a1)

(wherein, $R^0$ represents a hydrogen atom or methyl group, $R^1$ represents a single bond, $R^2$ represents an alkyl group of 1 to 5 carbon atoms, a represents an integer from 1 to 5, b represents either 0 or an integer from 1 to 4, a+b is no greater than 5, and if two or more $R^2$ groups exist, then said $R^2$ groups may be either identical or mutually different).

3. The photosensitive resin composition according to claim 2, wherein from 2 to 80% of hydrogen atoms of all phenolic hydroxyl groups are substituted with a naphthoquinone-1,2-diazide-5-(and/or -4-)sulfonyl group.

4. A color filter having a pattern formed using a photosensitive resin composition of any one of claims 1, 2 or 3.

* * * * *

UNITED STATES PATENT AND TRADEMARK OFFICE
CERTIFICATE OF CORRECTION

| | |
|---|---|
| PATENT NO. | : 7,858,275 B2 |
| APPLICATION NO. | : 11/908481 |
| DATED | : December 28, 2010 |
| INVENTOR(S) | : Ohnishi et al. |

It is certified that error appears in the above-identified patent and that said Letters Patent is hereby corrected as shown below:

Column 1, Line 47, change "2003-270784" to --2003-270784.--.

Column 3, Line 33, change "(at)" to --(a1)--.

Column 4, Line 3, change "improved," to --improved.--.

Column 4, Line 39, change "a" to --A--.

Column 4, Line 65, change "improved," to --improved.--.

Column 6, Line 24, change "furyl" to --furfuryl--.

Column 7, Line 7, change "chloracetate," to --chloroacetate,--.

Column 7, Line 8, change "dichloracetate," to --dichloroacetate,--.

Column 7, Lines 11-12, change "tetrachlorbenzoate," to --tetrachlorobenzoate,--.

Column 7, Line 18, change "chlormethylstyrene," to --chloromethylstyrene,--.

Column 7, Lines 21-22, change "chlorstyrene, dichlorstyrene," to --chlorostyrene, dichlorostyrene,--.

Column 7, Lines 22-23, change "trichlorstyrene, tetrachlorstyrene, pentachlorstyrene," to --trichlorostyrene, tetrachlorostyrene, pentachlorostyrene,--.

Column 11, Line 13, change "mJ/cm." to -- mJ/cm$^2$.--.

Signed and Sealed this
Fifth Day of July, 2011

David J. Kappos
*Director of the United States Patent and Trademark Office*